(12) United States Patent
Lan et al.

(10) Patent No.: US 8,502,382 B2
(45) Date of Patent: Aug. 6, 2013

(54) MEMS AND PROTECTION STRUCTURE THEREOF

(75) Inventors: Bang-Chiang Lan, Taipei (TW); Ming-I Wang, New Taipei (TW); Hui-Min Wu, Hsinchu County (TW); Min Chen, New Taipei (TW); Chien-Hsin Huang, Taichung (TW); Tzung-I Su, Yun-Lin County (TW); Chao-An Su, Kaohsiung (TW); Tzung-Han Tan, Taipei (TW); Li-Che Chen, Pingtung County (TW); Meng-Jia Lin, Changhua County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/459,268

(22) Filed: Apr. 30, 2012

(65) Prior Publication Data
US 2012/0205808 A1  Aug. 16, 2012

Related U.S. Application Data

(63) Continuation of application No. 12/538,168, filed on Aug. 10, 2009, now Pat. No. 8,193,640.

(51) Int. Cl.
*H01L 23/48* (2006.01)

(52) U.S. Cl.
USPC .................................. 257/753; 257/E23.01

(58) Field of Classification Search
USPC ............... 257/750, 753, 758, 773, E23.01, 257/678, 774, 786, 784, 691
See application file for complete search history.

(56) References Cited

U.S. PATENT DOCUMENTS

| | | | | |
|---|---|---|---|---|
| 5,502,337 A | * | 3/1996 | Nozaki | 257/773 |
| 5,892,283 A | * | 4/1999 | Baldwin et al. | 257/758 |
| 6,465,895 B1 | | 10/2002 | Park | |
| 7,741,716 B1 | | 6/2010 | Venkitachalam | |
| 8,193,640 B2 | * | 6/2012 | Lan et al. | 257/750 |
| 2010/0074458 A1 | | 3/2010 | Lan | |

* cited by examiner

*Primary Examiner* — Roy Potter
(74) *Attorney, Agent, or Firm* — Winston Hsu; Scott Margo

(57) ABSTRACT

A protection structure of a pad is provided. The pad is disposed in a dielectric layer on a semiconductor substrate and the pad includes a connection region and a peripheral region which encompasses the connection region. The protection structure includes at least a barrier, an insulation layer and a mask layer. The barrier is disposed in the dielectric layer in the peripheral region. The insulation layer is disposed on the dielectric layer. The mask layer is disposed on the dielectric layer and covers the insulation layer and the mask layer includes an opening to expose the connection region of the pad.

19 Claims, 4 Drawing Sheets

MEMS AND PROTECTION STRUCTURE THEREOF

CROSS REFERENCE TO RELATED APPLICATIONS

This is a continuation application of U.S. patent application Ser. No. 12/538,168 filed on Aug. 10, 2009, and the contents of which are included herein by reference.

BACKGROUND OF THE INVENTION

1. Field of the Invention

The present invention relates to a protection structure, especially a protection structure that is applicable to micro-electro-mechanical system (MEMS) and corresponding pads.

2. Description of the Prior Art

Along with the development of technology and the improvement of the semiconductor techniques, electronic devices are widely used in modern life. Micro-electro-mechanical system (MEMS) technology is to fabricate micro mechanical devices by using conventional semiconductor technologies such as electroplating, etching such that a mechanical component in a micro-meter scale may be formed. The MEMS device may be, for example, the voltage controlling component in an ink printer, the gyroscope in a car to detect the tilt of the car, or the vibration membrane in a microphone to sense a sound. The MEMS technology which combines the fabrication process of the mechanical and the electronic devices has the advantages of low cost, high performance and high density.

At present, the MEMS is usually integrated into a chip in a form of system on chip (SOC), especially a chip fabricated by a conventional CMOS process. For instance, a MEMS region and a CMOS region may be formed on a die simultaneously. In the present fabrication method to integrate the CMOS region and the MEMS region, many problems may occur. For example, when fabricating the CMOS and the MEMS devices, the influence of fabrication methods between each region and the usage interference of the product should be avoided, making it a serious problem that needs to be studied and overcome.

SUMMARY OF THE INVENTION

The present invention therefore provides a protection structure, especially a protection structure applicable to the pads on the non-MEMS region or to the border between the MEMS region and the non-MEMS region.

According to the claimed invention, a protection structure of a pad is provided. The pad is disposed in a dielectric layer on a semiconductor substrate and the pad includes a connection region and a peripheral region which encompasses the connection region. The protection structure includes at least a barrier, an insulation layer and a mask layer. The barrier is disposed in the dielectric layer in the peripheral region. The insulation layer is disposed on the dielectric layer. The mask layer is disposed on the dielectric layer and covers the insulation layer, and the mask layer includes an opening to expose the connection region of the pad.

According to the claimed invention, a semiconductor structure is further provided. The semiconductor structure includes a semiconductor substrate, a dielectric layer, a protection structure and a mask layer. The semiconductor substrate includes a MEMS region and a non-MEMS region and the dielectric layer is disposed on the semiconductor substrate. The protection structure is disposed between the MEMS region and the non-MEMS region, wherein the protection structure comprises: a top metal layer which is disposed in the dielectric layer, at least a first barrier which is disposed in the dielectric layer above the top metal layer, and an insulation layer disposed on the dielectric layer wherein the first barrier vertically connects the insulation layer and the top metal layer. The mask layer is disposed between the dielectric layer and is covering the insulation layer.

The protection structure can avoid the etchant such as HF to etch the components in the non-MEMS region such that the yield and the reliability of the product may be raised.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
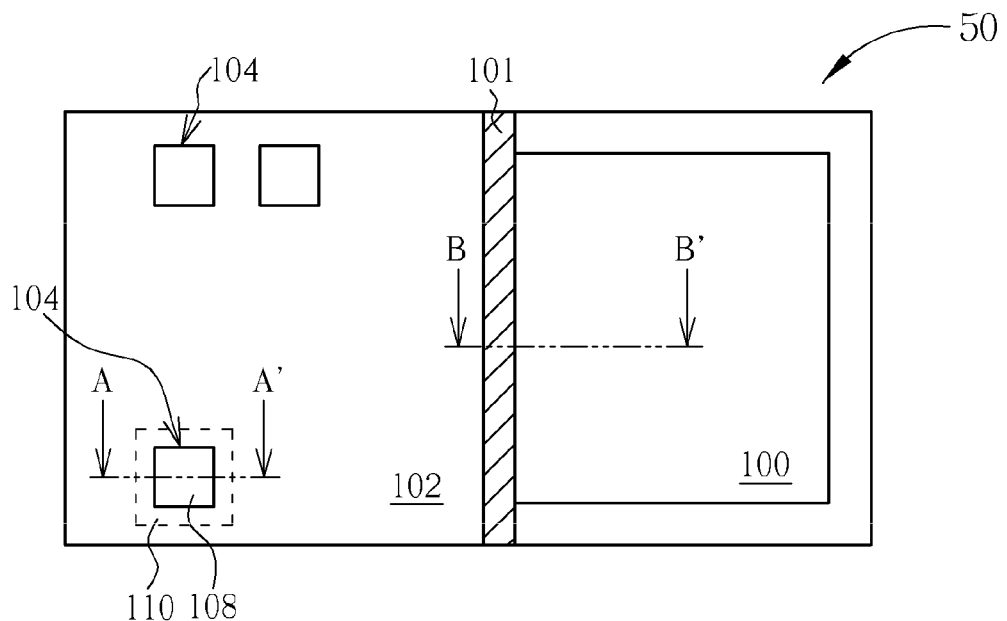
FIG. 1 illustrates one preferred embodiment from a top view of the MEMS region and the non-MEMS region in the present invention.

Please refer to FIG. 1, illustrating one preferred embodiment from a top view of the MEMS region and the non-MEMS region in the present invention. Only a die is shown in FIG. 1 for explanation of the protection structure which is applicable to the MEMS region and the pad in the present invention. The actual fabrication is applied to a wafer that includes a plurality of dies. As shown in FIG. 1, a die 50 includes a MEMS region 100 and a non-MEMS region 102. A variety of MEMS devices (not shown) are fabricated in the MEMS region 100, for example, a vibration membrane or a motor. The non-MEMS region 102 includes a logic region, a memory region or a periphery circuit region and a variety of semiconductor devices are disposed therein (not shown), such as some active or inactive components. The surface of the non-active region 102 includes a plurality of pads 104. The components in the non-MEMS region 102 can be driven by an outer signal through the pads 104 to carry out the input/output signal processing.

When fabricating the MEMS devices, at least an etching process is provided to the die 50 after finishing all the MEMS devices, the semiconductor devices and the metal interconnections. An etching gas such as HF, an etching solvent or other etchants is supplied to etch away the IMD layer in the MEMS region 100 and to form a variety of movable or mechanical components having 3D micro structures. In order to prevent the etchant leaking from the edge of the pads 104 or from the border between the MEMS region 100 and the non-MEMS region 102 into the non-MEMS region 102

(which may destruct the components in the non-MEMS region), the present invention provides a protection structure applicable to the pads 104 on the non-MEMS region or to the border between the MEMS region 100 and the non-MEMS region 102.

Figure 2:
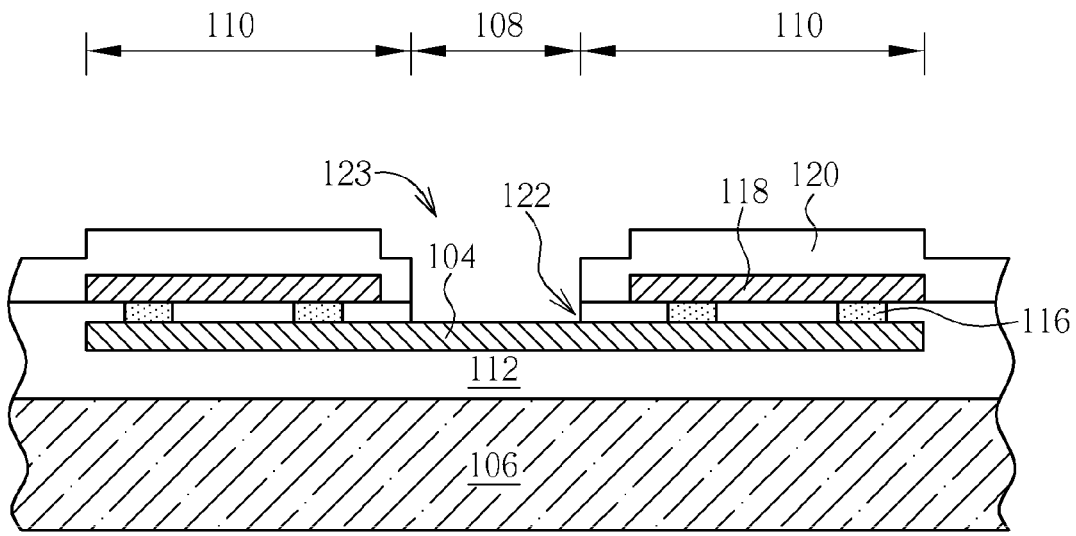
FIG. 2 illustrates a cross sectional schematic diagram of one preferred embodiment of the pad protection structure in the present invention.

The protection structure applicable to the pads 104 on the non-MEMS region 102 is provided at first. Please refer to FIG. 2, illustrating a cross sectional schematic diagram of one preferred embodiment of the pad protection structure in the present invention. FIG. 2 is a cross sectional diagram according to the AA' line as shown in FIG. 1. As shown in FIG. 2, a dielectric layer 112 and a pad 104 are disposed on a semiconductor substrate 106 of the die 50. The material of the dielectric layer 112 includes $SiO_2$, TEOS, PETEOS or other suitable IMD materials. The pad 104 disposed in the dielectric layer 112 includes conductive materials, such as tungsten, aluminum or copper. The pad 104 has a connection region 108 and a peripheral region 110. The connection region 108 is defined by the exposing region of the pad 104 such that a wire bonding or a soldering bonding may be formed herein in the follow-up package process. As shown in FIG. 1 in combination with FIG. 2, the peripheral region 110 encompasses the connection region 108.

As described above, in order to prevent the etchant 122 leaking from the edge of the pad 104 into the non-MEMS region 102 and destructing the components in the non-MEMS region 102, a protection structure is provided in the present invention. The protection structure includes at least a barrier 116, an insulation layer 118 and a mask layer 120. As shown in FIG. 2, when finishing the fabrication of the pad 104, the barrier 116 is formed by a fabrication process such as a conventional via plug process. The barrier 116 is disposed in the dielectric layer 112 in the peripheral region no and encompasses the connection region 108. The insulation layer 118 is disposed above the dielectric layer 112 and the barrier 116.

Figure 3:
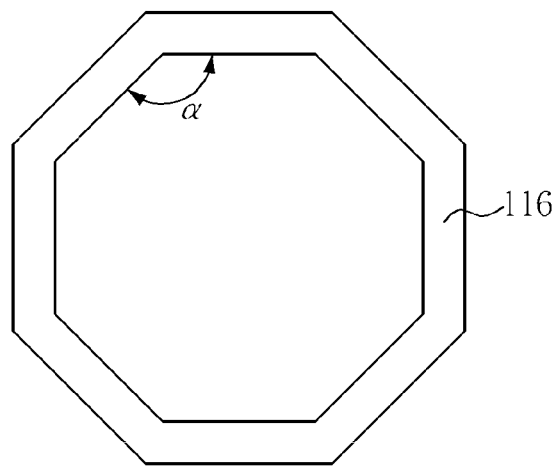
FIG. 3 illustrates a schematic diagram of one embodiment of the layout patter of the barrier in the present invention.

The barrier 116 has a continuous ring structure which includes tungsten, aluminum, amorphous silicon, silicon nitride or other anti-etching materials. The barrier 116, as shown in the top view in FIG. 1, encompasses the connection region 108 and exposes the connection region 108 of the pad 104; the barrier 116, as shown in the cross sectional view in FIG. 2, substantially contacts the insulation layer 118 upward and contacts the pad 104 downward. Accordingly, the barrier 116 forms an intact and closed protection structure to prevent the etchant 122 leaking from the edge of the pad 104 into the non-MEMS region 102. One embodiment of the protection structure may include a single barrier 116, or in another circumstance, may include a plurality of barriers 116 disposed between the insulation layer 118 and the pad 104, which are parallel to each other and encompass the connection region 108 together. The layout pattern of the barrier 116 may be a polygon, a circle or other closed structure. Please refer to FIG. 3, illustrating a schematic diagram of one embodiment of the layout patter of the barrier in the present invention. As shown in FIG. 3, the barrier 116 forms a polygon, in a preferred embodiment, the polygon includes an interior angle α with 130 degrees.

Figure 4:
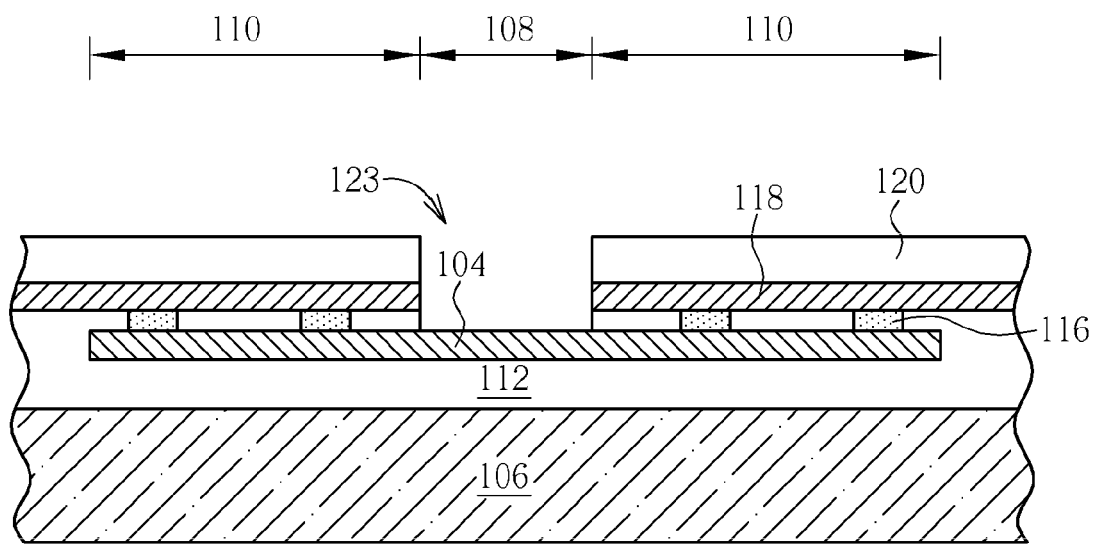
FIGS. 4-6 illustrate schematic diagrams of a preferred embodiment of the protection structure of the pad in the present invention.

The insulation layer 118 includes amorphous silicon or silicon nitride. Depending on different products, the materials of the insulation layer 118 and the barrier 116 may be the same, for example, both are amorphous silicon; in another circumstance, they may be different, for example, the insulation layer 118 is amorphous silicon and the barrier 116 is tungsten. The insulation layer 118 which is disposed on and connected to the barrier 116 may include a patterned structure, for example, the insulation layer 118 may include a ring structure corresponding to the layout pattern of the barrier 116 and encompasses the connection region 108 together with the barrier 116. In another embodiment of the present invention, the insulation layer 118 includes a lamination structure that fully covers the non-MEMS region 102. As shown in FIG. 4, the insulation layer 120 has the same layout pattern as the mask layer 120 and is fabricated by the same photo and etching process (PEP). Accordingly, the insulation layer 118 not only covers the peripheral region 110 but also covers the region outer the peripheral region 110. However, the connection region 108 should be exposed in principle.

Please refer to FIGS. 2 and 4. The mask layer 120 includes an opening 123 to expose the connection region 108 of the pad 104. The mask layer 120 disposed on the dielectric layer 112 and the insulation layer 118 has a lamination structure that fully covers on the non-MEMS region 102. The material of the mask layer 120 may include metal or other anti-etching materials. For instance, when the etchant is HF, the mask layer 120 may be aluminum. Because of the insulation layer 118 disposed under the mask layer 120, the direct contact between the mask layer 120 and the pad 104 which may bring to electrical short may be avoided.

Figure 5:
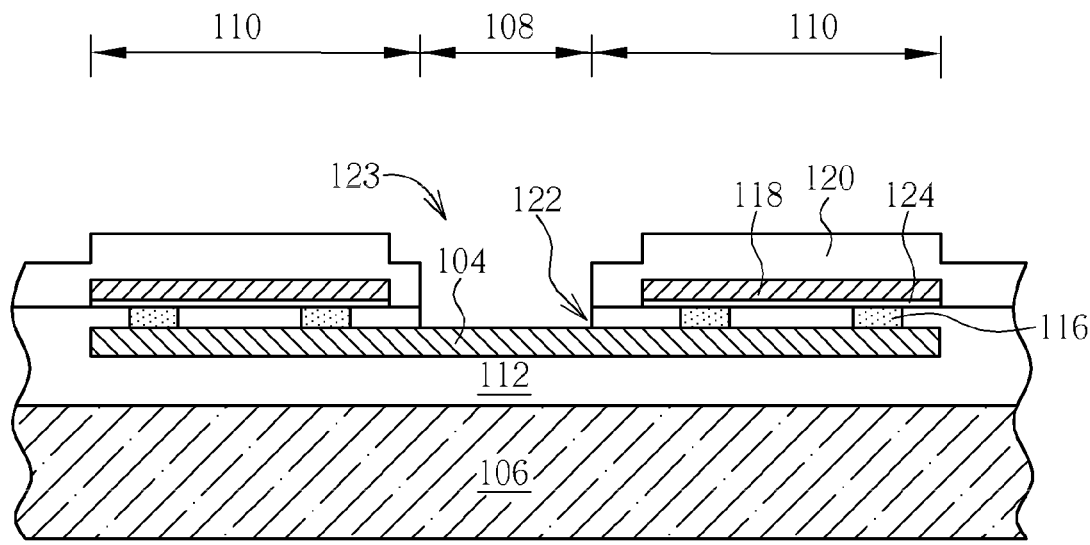

Pleas refer to FIG. 5, illustrating the schematic diagram of a preferred embodiment of the protection structure of the pad in the present invention. As shown in FIG. 5, the protection structure may further include a bottom layer 124 which is disposed under the insulation layer 118. The bottom layer 124 contacts the dielectric layer 112 and the barrier 116, as shown in FIG. 5. In another embodiment, the bottom layer 124 is disposed above the insulation layer 118 and is contacting the mask layer 120. The material of the bottom layer 120 includes silicon nitride, silicon oxynitride, HfSiON, $ZrO_2$, $HfO_2$, or other high-k dielectric materials.

Figure 6:
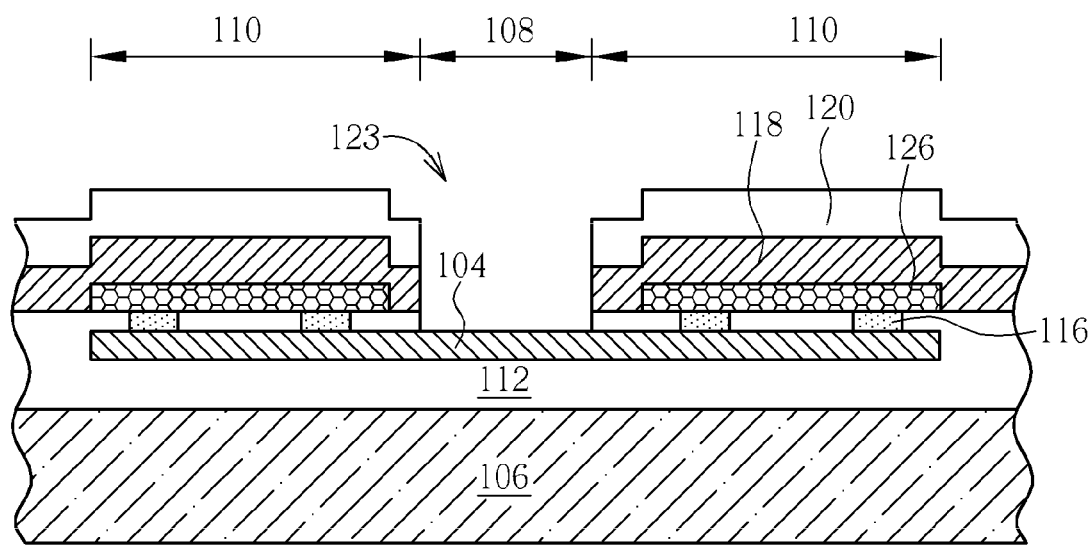

Please refer to FIG. 6, illustrating a schematic diagram of another preferred embodiment of the protection structure of the pad in the present invention. As shown in FIG. 6, the protection structure may further include an adhesion layer 126. The adhesion layer 126 may be disposed between the insulation layer 118 and the dielectric layer 112, or between insulation layer 118 and the mask layer 120, or disposed both between the insulation layer 118, the dielectric layer 112 and the mask layer 120. The material of the adhesion layer 126 includes Ti/TiN. It is noted that because the adhesion layer 126 is conductive, the adhesion layer 126 should not simultaneously contact the mask layer 120 and the barrier 116 such that an electrical short may be avoided.

Figure 7:
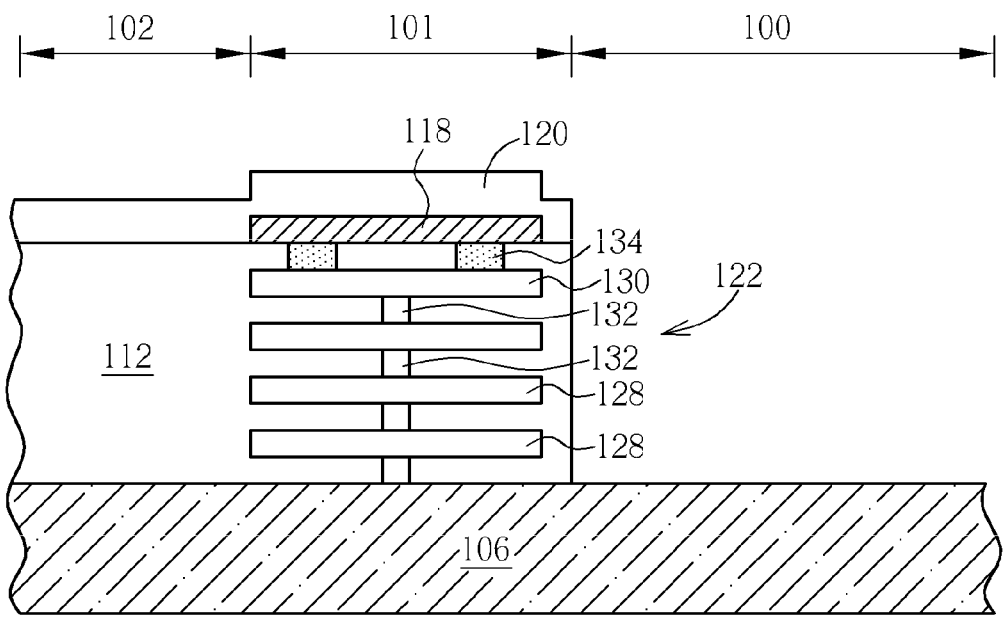
FIG. 7 illustrates a cross sectional diagram of the protection structure between the MEMS region and the non-MEMS region.

As described above, besides on the pad 104, the protection structure may also be formed between the MEMS region and the non-MEMS region. Please refer to FIG. 7, illustrating a cross sectional diagram of the protection structure between the MEMS region and the non-MEMS region. FIG. 7 is the cross sectional diagram according to the BB' line as shown in FIG. 7. As shown in FIG. 7, a semiconductor substrate 106 includes a MEMS region 100 and a non-MEMS region 102. A protection region 101 is disposed between the MEMS region 100 and the non-MEMS region 102. A dielectric layer 112 is disposed on the semiconductor substrate 106. In detail, the dielectric layer 112 is disposed in the protection region 101 and the non-MEMS region 102. The dielectric layer 112 in the MEMS region 100 is etched away by the etchant 122 to form a variety of movable or mechanical components with 3D micro structures (not shown).

To prevent the etchant 122 leaking into the non-MEMS region 102, a protection structure in the protection region 101 is provided. The protection structure includes an insulation layer 118, at least a first barrier 134, a top metal layer 130, a plurality of metal layers 128 and a plurality of second barriers 132. The plurality of metal layers 128 and the second barriers 132 are disposed in the dielectric layer 112, each of which is connected to each other vertically. The top of the metal layers 128 and the second barriers 132 contacts the top metal layer 130 and the bottom of the metal layers 128 and the second barriers contacts the semiconductor substrate 106. The top metal layer 130 is disposed corresponding to the plurality of metal layers 128 and the second barriers 132. The material of the metal layers 128, the second barriers 132 and the top metal layer 130 include aluminum, tungsten, copper or other anti-etching metal, which may be formed by conventional metal interconnection processes in the protection region 101. The first barrier 134 and the insulation layer 118 are disposed on the top metal layer 130. The material of the first barrier 134 includes tungsten, aluminum, amorphous silicon, silicon nitride or other anti-etching materials. One embodiment of the protection structure may include a single first barrier 134, or in another circumstance, may include a plurality of first barriers 134 which are parallel to each other. The material of the insulation layer 118 may include amorphous silicon or silicon nitride. Depending on different products, the materials of the insulation layer 118 and the first barrier 134 may be the same, for example, both are amorphous silicon; in another circumstance, they may be different, for example, the insulation layer 118 is amorphous silicon and the first barrier 134 is tungsten. The mask layer 120 which is disposed on the dielectric layer 112 and the insulation layer 118 has a lamination structure which fully covers the protection region 101 and the non-MEMS region 102 to avoid the surface of the non-MEMS region 102 being etched by the etchant 122.

Similarly, the protection structure in the present invention may further include an adhesion layer 126 or a bottom layer 124 which is described above. For the sake of simplicity, detailed description is not repeated herein.

Figure 8:
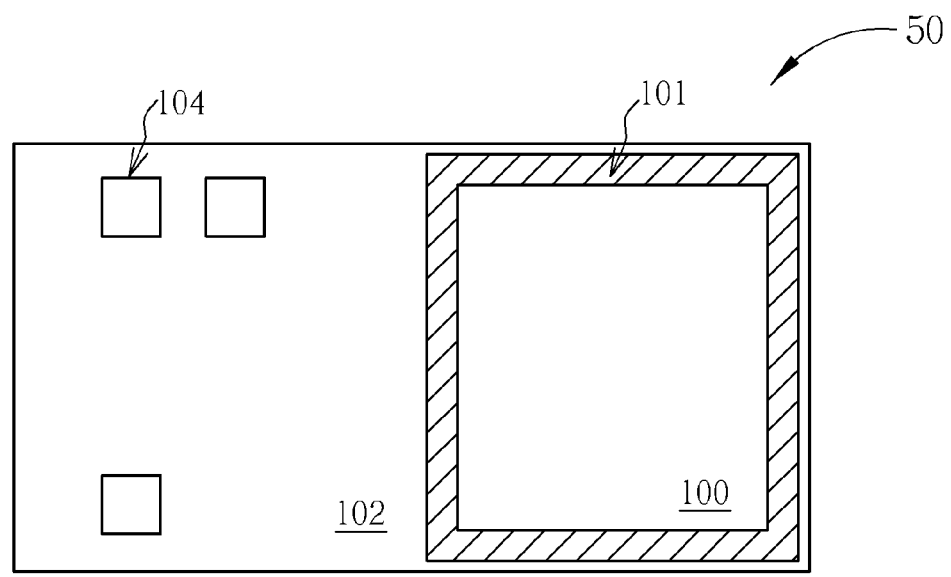
FIG. 8 illustrates a schematic diagram of a preferred embodiment of the protection structure of the pad in the present invention.

As shown in FIG. 7, the protection structure is formed between the MEMS region 100 and the non-MEMS region 102. The plurality of metal layers 128, the second barriers 132, the top metal layer 130, the first barrier 134 and the insulation layer 118 form an intact anti-etching structure to prevent the leaking of the etchant 122 from the MEMS region 100 into the non-MEMS region 102. The protection structure, besides the line pattern of the protection region 101 as shown in FIG. 1, may also be a closed ring structure that encompasses the MEMS region 100, as shown in FIG. 8. In this embodiment, the first barrier 134 may form a polygon; the polygon includes an interior angle α with 130 degrees, as shown in FIG. 4.

In summary, the protection structure is applicable to a conventional semiconductor pad or to a MEMS. The protection structure can avoid the etchant such as HF to etch the components in the non-MEMS region such that the yield and the reliability of the product may be raised.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A protection structure of a pad, wherein the pad is disposed in a dielectric layer on a semiconductor substrate and the pad comprises a connection region and a peripheral region which encompasses the connection region, the protection structure comprising:

a metal mask layer disposed above the dielectric layer, wherein the metal mask layer comprises an opening to expose the connection region of the pad.

2. The protection structure in claim 1, further comprising at least a barrier disposed in the dielectric layer of the peripheral region and on the pad, wherein the barrier encompasses the connection region.

3. The protection structure in claim 2, wherein the barrier comprises tungsten, aluminum, amorphous silicon or silicon nitride.

4. The protection structure in claim 2, further comprising an insulation layer disposed on the dielectric layer, wherein the barrier vertically connects the insulation layer and the pad.

5. The protection structure in claim 4, wherein the insulation layer comprises amorphous silicon or silicon nitride.

6. The protection structure in claim 4, further comprising a bottom layer disposed under the insulation layer.

7. The protection structure in claim 6, wherein the bottom layer comprises silicon nitride, silicon oxynitride, HfSiON, $ZrO_2$ or $HfO_2$.

8. The protection structure in claim 4, further comprising an adhesion layer disposed between the insulation layer and the metal mask layer.

9. The protection structure in claim 8, wherein the adhesion layer comprises Ti/TiN.

10. The protection structure in claim 1, wherein the metal mask layer comprises aluminum.

11. A semiconductor structure, comprising:
a semiconductor substrate, comprising a MEMS region and a non-MEMS region;
a dielectric layer disposed on the semiconductor substrate; and
a protection structure disposed between the MEMS region and the non-MEMS region, wherein the protection structure comprises:
a top metal layer disposed in the dielectric layer; and
a metal mask layer disposed above the dielectric layer.

12. The semiconductor structure in claim 11, further comprising at least a first barrier disposed in the dielectric layer above the top metal layer.

13. The semiconductor structure in claim 12, wherein the first barrier comprises tungsten, aluminum, amorphous silicon or silicon nitride.

14. The semiconductor structure in claim 12, further comprising an insulation layer disposed on the dielectric layer, wherein the first barrier vertically contacts the insulation layer and the top metal layer.

15. The semiconductor structure in claim 14, wherein the insulation layer comprises amorphous silicon or silicon nitride.

16. The semiconductor structure in claim 14, further comprising a bottom layer disposed under the insulation layer.

17. The semiconductor structure in claim 14, further comprising an adhesion layer disposed between the insulation layer and the metal mask layer.

18. The semiconductor structure in claim 17, wherein the adhesion layer comprises Ti/TiN.

19. The semiconductor structure in claim 11, wherein the protection structure further comprises a plurality of metal layers and a plurality of second barriers which are disposed between the top metal layer and the semiconductor substrate and are connected to each other vertically.

* * * * *